US006548876B2

(12) United States Patent
Ju

(10) Patent No.: US 6,548,876 B2
(45) Date of Patent: Apr. 15, 2003

(54) SEMICONDUCTOR DEVICE OF SUB-MICRON OR HIGH VOLTAGE CMOS STRUCTURE AND METHOD FOR MANUFACTURING THE SAME

(75) Inventor: Jae Il Ju, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/987,073

(22) Filed: Nov. 13, 2001

(65) Prior Publication Data

US 2002/0058369 A1 May 16, 2002

(30) Foreign Application Priority Data

Nov. 14, 2000 (KR) ......................................... 2000-67429

(51) Int. Cl.$^7$ ......................................... H01L 21/8238
(52) U.S. Cl. .................... 257/377; 257/371; 438/163; 438/233; 438/533; 438/684
(58) Field of Search ................... 257/206, 288, 257/327, 336, 341, 343, 368, 377, 382, 408, 929; 438/163, 211, 224, 228, 233, 533, 586, 684

(56) References Cited

U.S. PATENT DOCUMENTS

| 4,397,076 A | * | 8/1983 | Honnigford et al. | ........ 438/280 |
| 4,473,941 A | * | 10/1984 | Turi et al. | ................... 438/380 |
| 5,384,277 A | * | 1/1995 | Hsu et al. | ................... 438/243 |
| 5,780,349 A | * | 7/1998 | Naem | ......................... 438/305 |
| 6,258,714 B1 | * | 7/2001 | Shrivastava | ................. 438/638 |

* cited by examiner

*Primary Examiner*—George Fourson
*Assistant Examiner*—Thanh V Pham
(74) *Attorney, Agent, or Firm*—Morgan, Lewis & Bockius LLP

(57) ABSTRACT

A semiconductor device includes a semiconductor substrate, a barrier film in a field region of the semiconductor substrate, first and second conductivity-type well regions in the semiconductor substrate and divided by the barrier film in a surface of the semiconductor substrate, a gate insulating film on an entire surface of the semiconductor substrate, a gate electrode on a region of the gate insulating film, a lightly-doped first conductivity-type impurity region formed in the second conductivity-type well region at a first side of the gate electrode, a lightly-doped second conductivity-type impurity region formed in the first conductivity-type well region at a second side of the gate electrode, a conductive pattern connected with the lightly-doped first and second conductivity-type impurity regions and having a constant distance from the gate electrode, an insulating film formed on the semiconductor substrate exposing upper portions of the gate electrode and the conductive pattern, and heavily-doped first and second conductivity-type impurity regions formed on the lightly-doped first and second conductivity-type impurity regions below the conductive pattern.

8 Claims, 6 Drawing Sheets

SEMICONDUCTOR DEVICE OF SUB-MICRON OR HIGH VOLTAGE CMOS STRUCTURE AND METHOD FOR MANUFACTURING THE SAME

The present invention claims the benefit of Korean Patent Application No. P2000-67429 filed in Korea on Nov. 14, 2000, which is hereby incorporated by reference.

BACKGROUND OF THE INVENTION

1. Field of the Invention

The present invention relates to a semiconductor device and a method for manufacturing the same, and more particularly, to a semiconductor device and a method for manufacturing the same that obtains a sub-micron complementary metal-oxide semiconductor (CMOS) device or a high voltage CMOS device.

2. Discussion of the Related Art

Presently, 0.25-micron MOS transistors are an example of the continuing miniaturization of MOS transistors that have fallen in size from the micron range to the low sub-micron range in a few short years. The advantages of utilizing ever smaller MOS transistors are that these devices reduce the cost of providing logic functions due to the increased number of transistors that can be integrated into a single package, and extend the life of battery-operated devices due to the lower voltage requirements of the smaller transistors.

One problem with utilizing current-generation 0.25-micron transistors, however, is that these transistors often function poorly when required to provide analog and mixed-signal functions due to the higher leakage currents and smaller dynamic ranges of these transistors.

With digital transistors, higher leakage currents contribute to increased power dissipation whereas leakage currents in analog transistors are particularly problematic in that these currents may render some analog circuits completely non-functional or lead to random errors. The higher leakage current in deep sub-micron processes is attributed to non-complete turn-off of the transistors due to the low threshold voltages. This is particularly true for very short channel transistors.

With respect to the dynamic range, current-generation 0.25 micron devices typically operate off of a 2.5-volt supply voltage, whereas previous generation 0.35 and 0.5 micron devices commonly operated off of 3.3 and 5-volt supply voltages, respectively. Thus, current-generation MOS transistors provide approximately two-thirds to one-half of the dynamic range of the older devices.

One solution to this problem is to utilize the 0.25-micron transistors when implementing the digital functions of a circuit, and the 0.35 or 0.5-micron transistors when implementing the analog or mixed-signal functions of the circuit.

A related art semiconductor device will be described with reference to the accompanying drawings.

FIG. 1 is a sectional view showing a structure of the related art semiconductor device.

As shown in FIG. 1, a related art semiconductor device includes a semiconductor substrate 11, a barrier film 12, a gate electrode 14, an insulating sidewall 15, a lightly doped n-type impurity region 16, and a heavily doped n-type impurity region 16. The semiconductor substrate 11 includes an active region and a field region. The barrier film 12 is formed in the field region of the semiconductor substrate 11. The gate electrode 14 is formed on the active region of the semiconductor substrate 11 by interposing a gate insulating film 13 with a constant width. Then, the insulating sidewall 15 is formed at both sides of the gate electrode 14. The lightly doped n-type impurity region 16 is formed in a surface of the semiconductor substrate 11 at both sides of the gate electrode 14. The heavily doped n-type impurity region 17 is formed in a surface of the semiconductor substrate 11 at both sides of the insulating sidewall 15 in a shallower depth than a depth of the lightly doped n-type impurity region 16.

However, the related art semiconductor device has the following problems.

The device characteristics are determined by a size of the insulating sidewall formed at both sides of the gate electrode, a depth of junction, and a density of junction. Therefore, there is a limitation to miniaturize the semiconductor device and to obtain high quality of the device.

SUMMARY OF THE INVENTION

Accordingly, the present invention is directed to a semiconductor device that substantially obviates one or more problems due to limitations and disadvantages of the related art.

An object of the present invention is to provide a semiconductor device that obtains miniaturization of a CMOS device and high quality of the device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, a semiconductor device includes a semiconductor substrate, a barrier film in a field region of the semiconductor substrate, first and second conductivity-type well regions in the semiconductor substrate and divided by the barrier film in a surface of the semiconductor substrate, a gate insulating film on an entire surface of the semiconductor substrate, a gate electrode on a region of the gate insulating film, a lightly-doped first conductivity-type impurity region formed in the second conductivity-type well region at a first side of the gate electrode, a lightly-doped second conductivity-type impurity region formed in the first conductivity-type well region at a second side of the gate electrode, a conductive pattern contacting the lightly-doped first and second conductivity-type impurity regions and having a constant distance from the gate electrode, an insulating film formed on the semiconductor substrate exposing upper portions of the gate electrode and the conductive pattern, and heavily-doped first and second conductivity-type impurity regions formed on the lightly-doped first and second conductivity-type impurity regions below the conductive pattern.

In another aspect of the present invention, a method for manufacturing a semiconductor device includes the steps of forming a barrier film in a field region of a semiconductor substrate, forming a first conductivity-type well region and a second conductivity-type well region, forming a gate insulating film on an entire surface of the semiconductor substrate, forming a plurality of contact holes in the gate insulating film, forming a conductive pattern inside each contact hole, forming a gate electrode on the gate insulating film between the conductive patterns, forming a lightly-doped first conductivity-type impurity region in the first conductivity-type well region at a first side of the gate electrode, forming a lightly-doped second conductivity-type impurity region in the second conductivity-type well region at a second side of the gate electrode, forming an insulating film on the semiconductor substrate to expose an upper portion of the conductive pattern and the gate electrode, and forming heavily-doped first and second conductivity-type impurity regions on the lightly-doped first and second conductivity-type impurity regions below the conductive pattern.

In another aspect of the present invention, a semiconductor device includes a semiconductor substrate, a first conductivity-type well region in the semiconductor substrate, a plurality of lightly-doped second conductivity-type impurity regions formed in opposing portions of the first conductivity-type well region, a plurality of heavily-doped second conductive-type impurity regions formed in the lightly-doped second conductivity-type impurity regions, a gate insulating film on the semiconductor substrate, the gate insulating film having a plurality of first contact holes exposing portions of the heavily-doped second conductivity-type impurity regions, a gate electrode on the gate insulating film, the gate electrode having upper and lower surfaces, an insulating layer on the gate insulating film having upper and lower surfaces, the upper and lower surfaces of the insulating layer are coplanar with upper and lower surfaces of the gate electrode, respectively, a plurality of second contact holes formed in the insulating layer, each of the second contact holes are concentric with each of the plurality of first contact holes, and a plurality of conductive patterns in the first and second pluralities of contact holes contacting the heavily-doped second conductivity-type impurity regions, the conductive patterns having an upper surface coplanar with the upper surfaces of the gate electrode and insulating layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
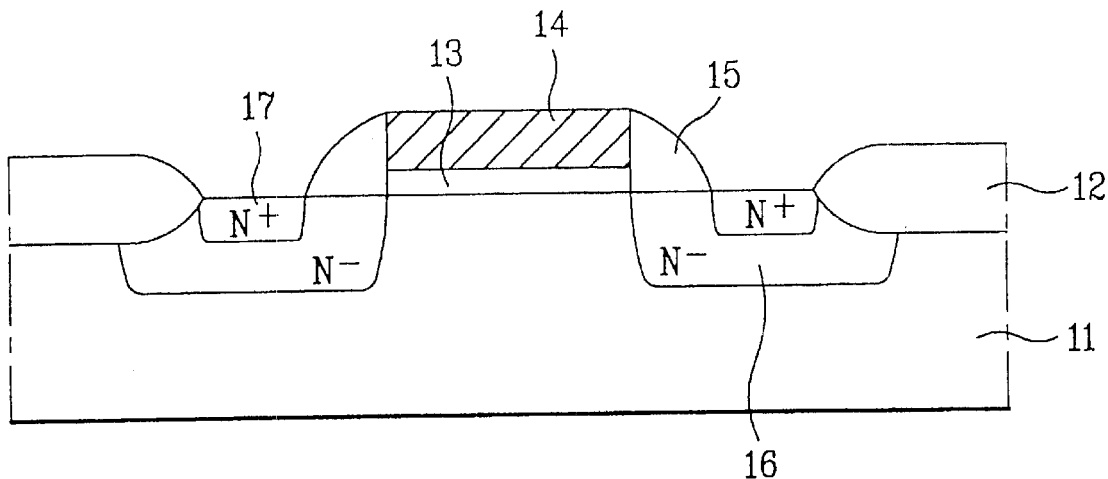
FIG. 1 is a sectional view of a semiconductor device according to a related art.
Figure 2:
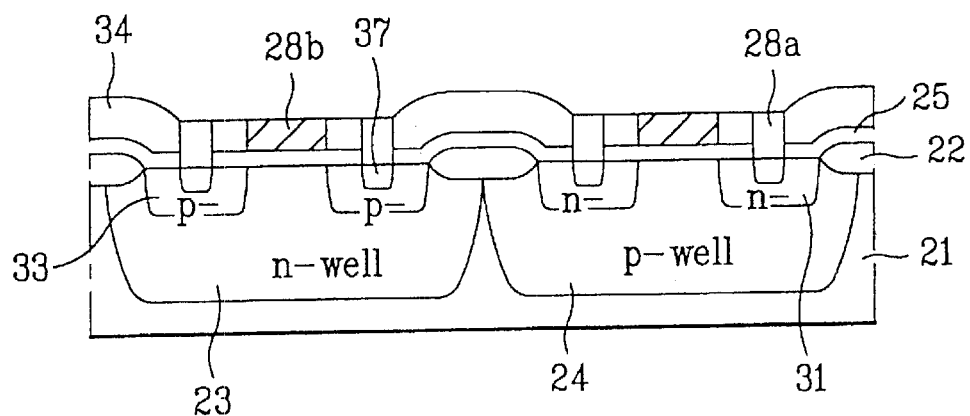
FIG. 2 is a sectional view showing an exemplary semiconductor device according to the present invention.

FIG. 2 is a cross sectional view showing an exemplary semiconductor device according to the present invention. In FIG. 2, a semiconductor substrate 21 may include a barrier film 22, n-type and p-type well regions 23 and 24, a gate insulating film 25, a gate electrode 28b, lightly-doped $p^-$-type and $n^-$-type impurity regions 33 ad 31, an high temperature and low-pressure dielectric (HLD) film 34, a poly-silicon contact 28a, and heavily-doped $p^+$-type and $n^+$-type impurity regions 37 and 38.

The barrier film 22 may be formed in a field region of the semiconductor substrate. The barrier film 22 may be formed to divide n-type and p-type well regions 23 and 24 in a surface of the semiconductor substrate 21. Then, the gate insulating film 25 may be formed on an entire surface of the semiconductor substrate 21, and the gate electrode 28b may be formed in a region of the gate insulating film 25 having the n-type and p-type well regions 23 and 24. The lightly-doped $p^-$-type and $n^-$-type impurity regions 33 and 31 are formed on the n-type and p-type well regions 23 and 24 at both sides of the gate electrode 28b, respectively. The HLD film 34 may be formed on the semiconductor substrate 21 to have a height equivalent to a height of an upper surface of the gate electrode 28b. Additionally, a polysilicon contact 28a may be formed at a height of the gate electrode 28b to maintain a constant distance from the gate electrode 28b, which may be connected with the lightly-doped $p^-$-type and $n^-$-type impurity regions 33 and 31. Then, the heavily-doped $p^+$-type and $n^+$-type impurity regions 37 and 38 may be formed in the lightly-doped $p^-$-type and $n^-$-type impurity regions 33 and 31 below the polysilicon contact 28a, respectively.

Figure 3A:
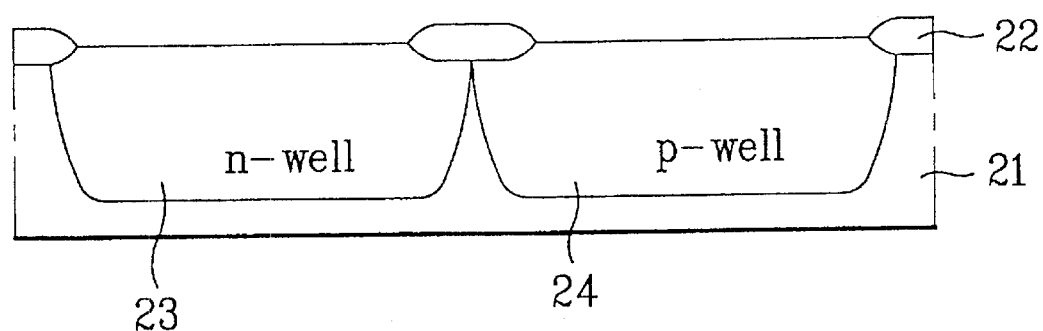
FIG. 3A to FIG. 3J show an exemplary manufacturing process according to the present invention.

FIG. 3A to FIG. 3J show an exemplary manufacturing process according to the present invention. In FIG. 3a, a barrier film 22 may be formed in a field region 21 of a semiconductor substrate 21 defined by active and field regions. Then, n-type and p-type well regions 23 and 24 may be fanned in a surface of the semiconductor substrate 21 by selectively injecting a n-type or p-type impurity ions, for example. Accordingly, the barrier film 22 may be formed by local oxidation of silicon on sapphire (LOCOS) process or a shallow trench isolation (STI) process, for example.

When the n-type well region 23 is formed, a portion where the p-well region 24 will be formed is masked. Then, the n-type impurity ions are injected into the substrate 21 to form the n-type well region 23. Conversely, when the p-type well region 24 is formed, a portion where the n-type well region 23 will be formed is masked, and then the p-type impurity ions are injected into the substrate 21 to form the p-type well region 24.

Figure 3B:
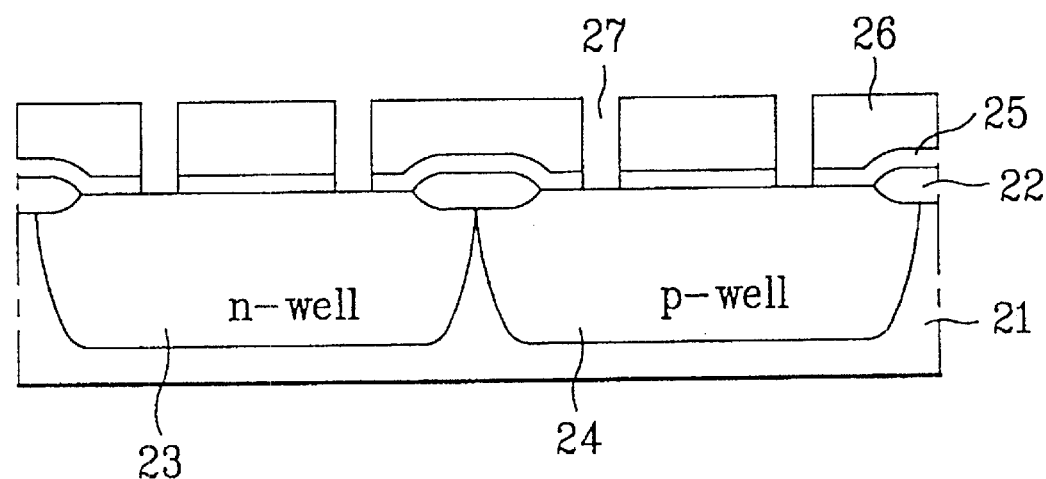

In FIG. 3B, a gate insulating film 25 may be formed on an entire surface of the semiconductor substrate 21 including the barrier film 22. Then, a first photoresist layer 26 may be deposited on the gate insulating film 25, and subsequently patterned by exposing and developing processes to define a polysilicon contact region, for example. Subsequently, the gate insulating film 25 may be selectively removed to expose a surface of the semiconductor substrate 21 in a region by using the patterned first photoresist 26 as a mask, thereby forming a contact hole 27.

Figure 3C:
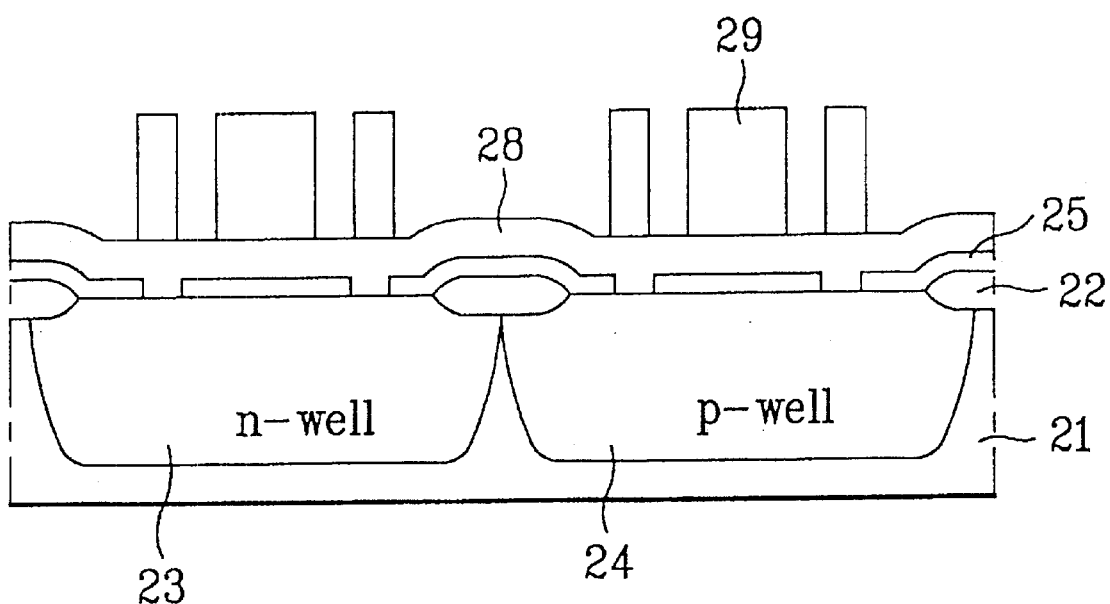

In FIG. 3C, the first photoresist 26 is removed, and then a poly silicon film 28 may be formed on the entire surface of the semiconductor substrate 21 including the contact hole 27. Subsequently, a second photoresist 29 may be deposited on the poly silicon film 28, and then patterned by exposing and developing processes to define contact and gate regions, for example.

Figure 3D:
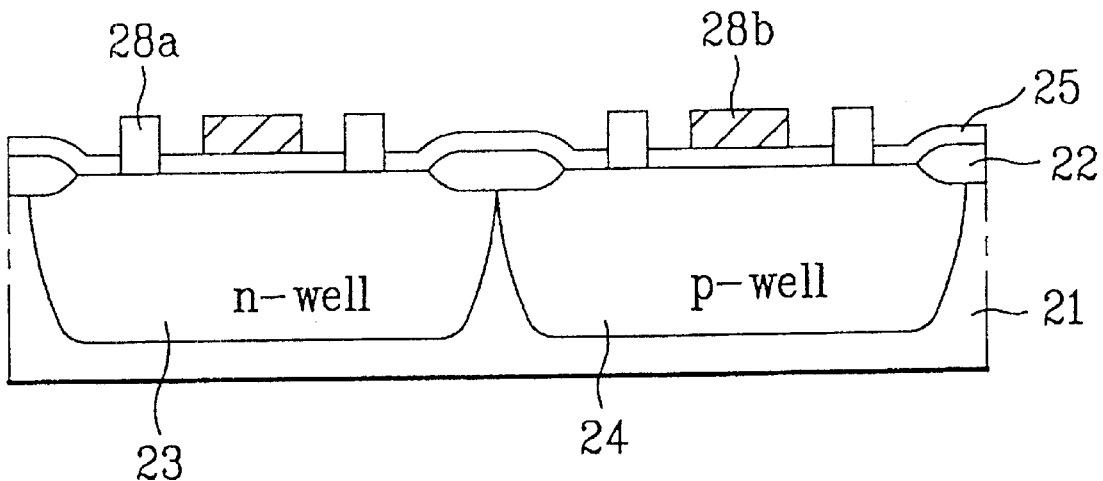

In FIG. 3D, the poly silicon film 28 may be selectively removed by using the patterned second photoresist 29 as a mask, thereby forming the poly silicon contact 28a and the gate electrode 28b. Then, the second photoresist 29 may be removed.

Figure 3E:
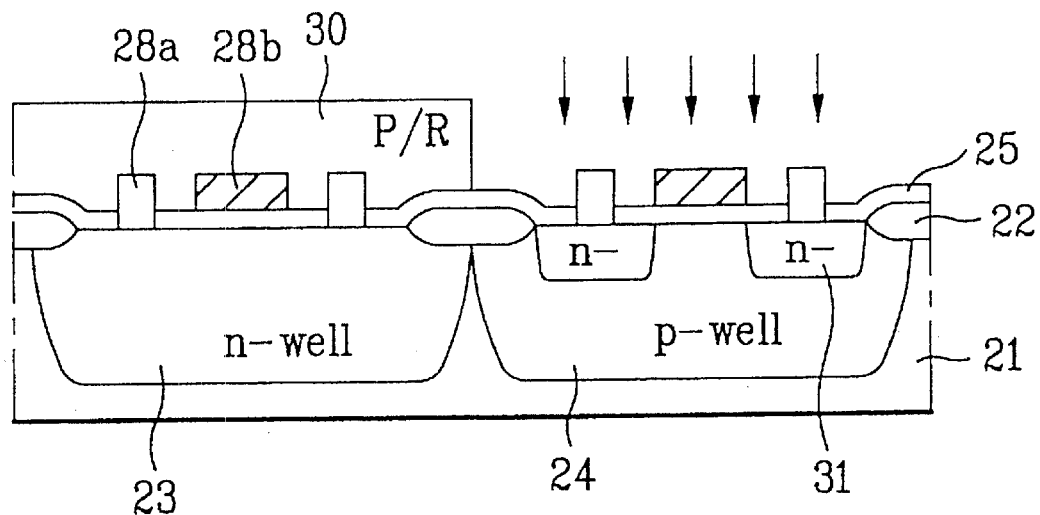

In FIG. 3E, a third photoresist 30 may be deposited on the semiconductor substrate 21, and then patterned to mask the n-type well region 23 by exposing and developing processes. Subsequently, an n-type impurity ion may be injected into the substrate 21 by using the patterned third photoresist 30 as the mask, thereby forming a lightly-doped n⁻-type impurity region 31 in the p-type well region 24 at both sides of the gate electrode 28b.

Figure 3F:
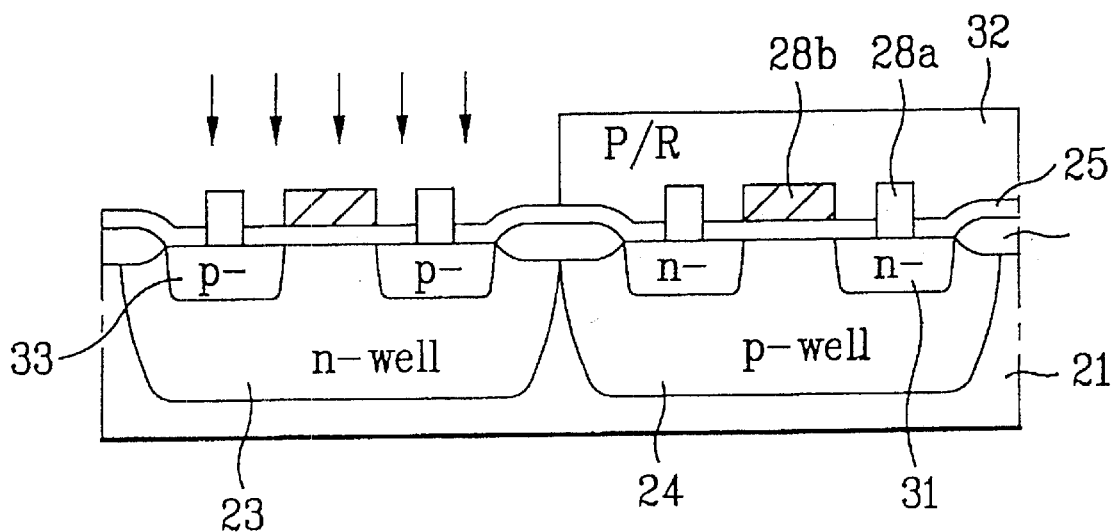

In FIG. 3F, the third photoresist 30 may be removed. Then, a fourth photoresist 32 may be deposited on the semiconductor substrate 21, and then patterned to mask the n-type well region 24 by exposing and developing processes. A p-type impurity ion may be injected by using the patterned fourth photoresist as a mask, thereby forming a lightly-doped p⁻-type impurity region 33 in the n-type well region 23 at both sides of the gate electrode 28b.

Figure 3G:
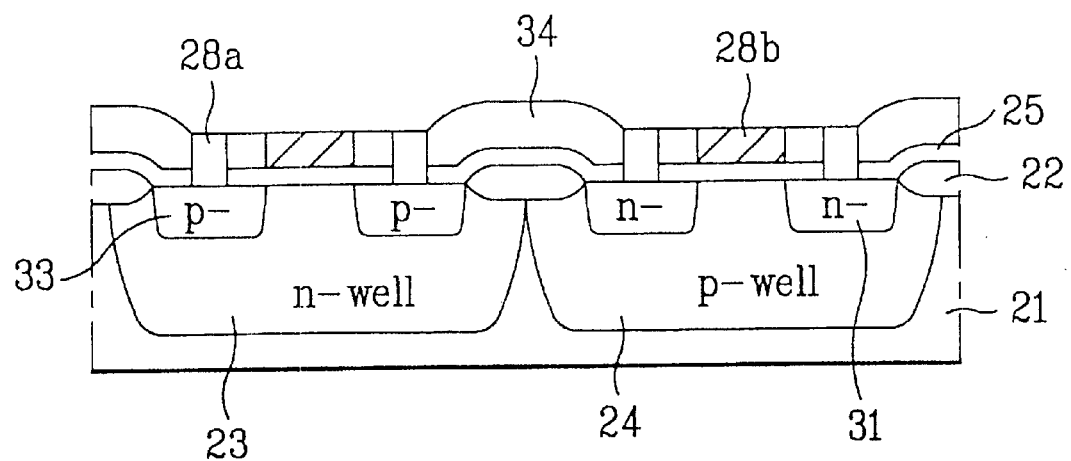

In FIG. 3G, the fourth photoresist 32 is removed, and then a HLD film 34 may be deposited on the entire surface of the semiconductor substrate 21. Then, the HLD film 34 may be selectively polished to expose surfaces of the gate electrode 28b and the polysilicon pattern 28a by a chemical mechanical polishing (CMP) process, for example.

Figure 3H:
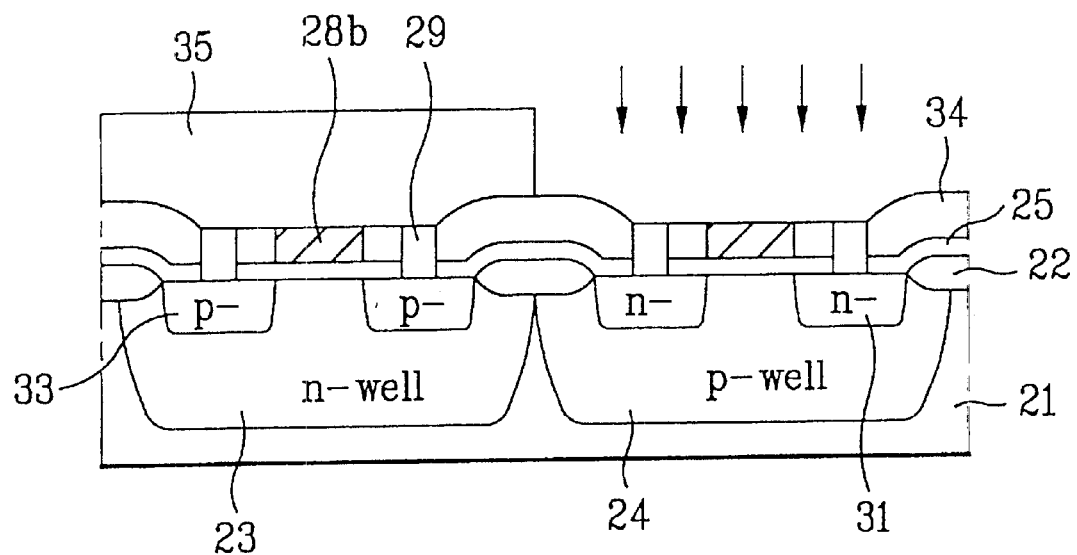

In FIG. 3H, a fifth photoresist 35 may be deposited on the surface of the semiconductor substrate 21 including the HLD film 34, and then patterned to mask the n-type well region 23 by exposing and developing processes. N-type impurity ions may be injected into the gate electrode 28b and the polysilicon contact 28a formed in the p-type well region by using the patterned fifth photoresist 35 as the mask.

Figure 3I:
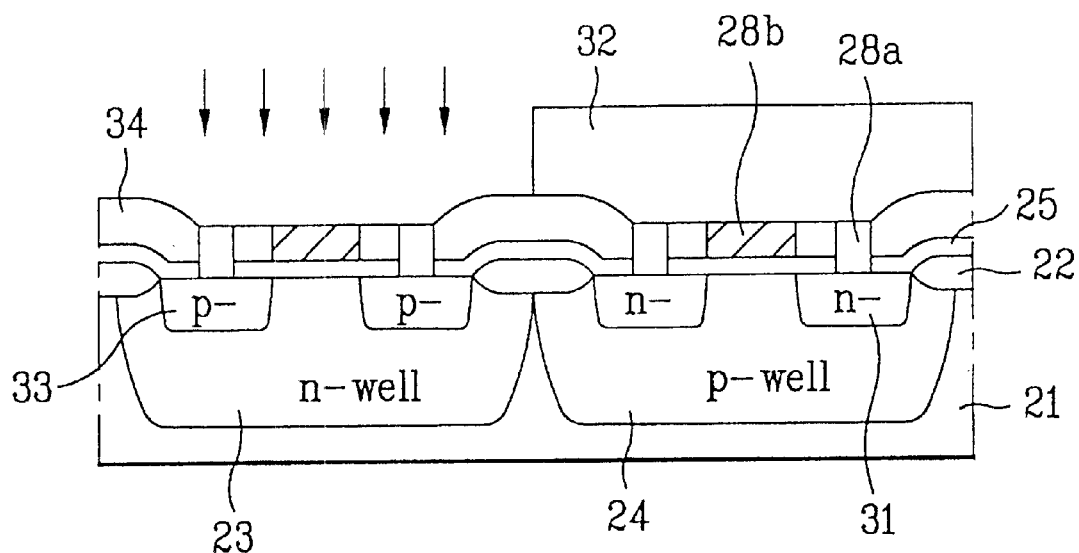

In FIG. 3I, the fifth photoresist 35 may be removed. Then, a sixth photoresist 36 may be deposited on the semiconductor substrate 21 including the HLD film 34, and patterned to mask the p-type well region 24 by exposing and developing processes. P-type ions may be injected into the gate electrode 28b and poly silicon contact 28a formed in the n-type well region 23 by using the patterned sixth photoresist 36 as the mask.

Figure 3J:
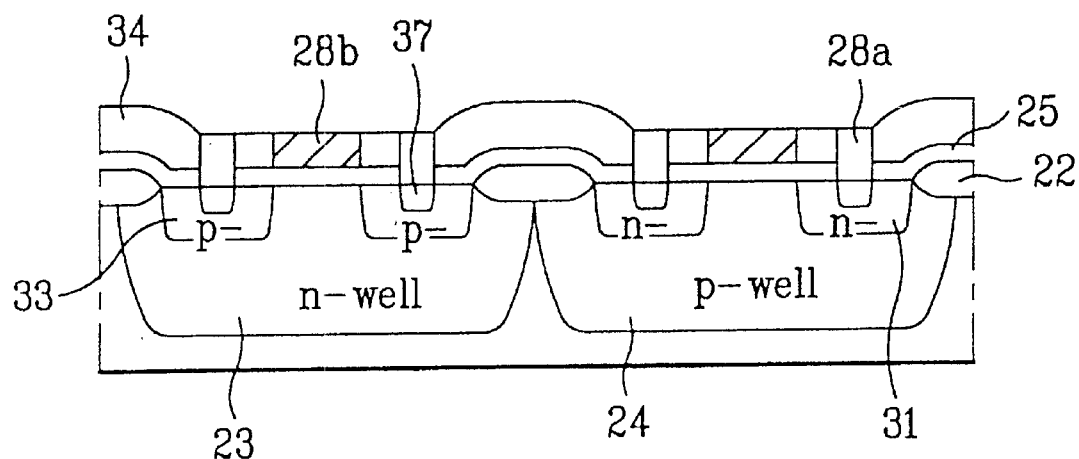

In FIG. 3J, the sixth photo resist 36 may be removed, and then an annealing process is performed on the semiconductor substrate 21 to diffuse the n-type and p-type impurity ions injected into the poly silicon contact 28a. Accordingly, heavily-doped p⁺-type and n⁺-type impurity regions 37 and 38 are formed in the lightly-doped p⁻-type and n⁻-type impurity regions 33 and 31, respectively, below the polysilicon contact 28a.

The semiconductor device and the method for manufacturing the same according to the present invention have the following advantages. First, miniaturization and higher integration of a CMOS device can be obtained, thereby obtaining reliability in static electricity characteristic, for example. Also, it is possible to obtain the device that can stand inner pressure. Furthermore, it is not required to form an insulating sidewall at both sides of the gate electrode by depositing an additional insulating film and etching the insulating film, thereby simplifying the process steps.

It will be apparent to those skilled in the art that various modifications and variations can be made in the semiconductor device and method of manufacturing a semiconductor device of the present invention without departing from the spirit or scope of the invention. Thus, it is intended that the present invention cover the modifications and variations of this invention provided they come within the scope of the appended claims and their equivalents.

What is claimed is:

1. A semiconductor device, comprising:
    a semiconductor substrate;
    a barrier flint in a field region of the semiconductor substrate;
    first and second conductivity-type well regions in the semiconductor substrate and divided by the barrier film in a surface of the semiconductor substrate;
    a gate insulating film on an entire surface of the semiconductor substrate;
    a gate electrode on a region of the gate insulating film;
    a lightly-doped first conductivity-type impurity region formed in the second conductivity-type well region at a first side of the gate electrode;
    a lightly-doped second conductivity-the impurity region formed in the conductivity-type well region at a second side of the gate electrode;
    a conductive pattern contacting the lightly-doped first and second conductivity-type impurity regions and having a constant distance from the gate electrode;
    an insulating film formed on the semiconductor substrate exposing upper portions of the gate electrode and the conductive pattern; and
    heavily-doped first and second conductivity-type impurity regions formed on the lightly-doped first and second conductivity-type impurity regions below the conductive pattern,
    wherein an upper surface of the gate electrode is level with an upper surface of the conductive pattern.

2. The device according to claim 1, wherein the gate electrode and the conductive pattern include polysilicon.

3. The device according to claim 1, wherein the heavily-doped first and second conductivity-type impurity regions are formed at a depth shallower than a depth of the lightly-doped first and second conductivity-type impurity regions.

4. The device according to claim 1, wherein the insulating film is an high temperature, low-pressure dielectric film.

5. The device according to claim 1, wherein the first conductivity-type is n-type, and the second conductivity-type is p-type.

6. A semiconductor device, comprising:
    a semiconductor substrate;
    a first conductivity-type well region in the semiconductor substrate;
    a plurality of lightly-doped second conductivity-type impurity regions formed in opposing portions of the first conductivity-type well region;
    a plurality of heavily-doped second conductive-type impurity regions formed in the lightly-doped second conductivity-type impurity regions;
    a gate insulating film on the semiconductor substrate, the gate insulating film having a plurality of first contact holes exposing portions of the heavily-doped second conductivity-type impurity regions;
    a gate electrode on the gate insulating film, the gate electrode having upper and lower surfaces;
    an insulating layer on the gate insulating film having upper and lower surfaces, the upper and lower surfaces of the insulating layer are coplanar with upper and lower surfaces of the gate electrode, respectively;
    a plurality of second contact holes formed in the insulating layer, each of the second contact holes are concentric with each of the plurality of first contact holes; and
    a plurality of conductive patterns in the first and second pluralities of contact holes contacting the heavily-doped second conductivity-type impurity regions, the conductive patterns having an upper surface coplanar with the upper surfaces of the gate electrode and insulating layer.

7. The device according to claim 6, wherein the gate electrode and the conductive patterns include polysilicon.

8. The device according to claim 6, wherein the heavily-doped second conductivity-type impurity regions are formed at a depth shallower than a depth of the lightly-doped second conductivity-type impurity regions.

* * * * *